(12) United States Patent
Yajima et al.

(10) Patent No.: US 11,602,819 B2
(45) Date of Patent: Mar. 14, 2023

(54) METHOD FOR POLISHING USING POLISHING PAD PROVIDED WITH ADSORPTION LAYER

(71) Applicant: MARUISHI SANGYO CO., LTD., Tokyo (JP)

(72) Inventors: Toshiyasu Yajima, Tokyo (JP); Daisuke Ninomiya, Tokyo (JP)

(73) Assignee: MARUISHI SANGYO CO., LTD., Tokyo (JP)

( * ) Notice: Subject to any disclaimer, the term of this patent is extended or adjusted under 35 U.S.C. 154(b) by 725 days.

(21) Appl. No.: 16/603,984

(22) PCT Filed: Jun. 1, 2018

(86) PCT No.: PCT/JP2018/021263
§ 371 (c)(1),
(2) Date: Oct. 9, 2019

(87) PCT Pub. No.: WO2018/225658
PCT Pub. Date: Dec. 13, 2018

(65) Prior Publication Data
US 2020/0147749 A1   May 14, 2020

(30) Foreign Application Priority Data
Jun. 6, 2017 (JP) ............................. JP2017-111475

(51) Int. Cl.
*B24B 37/22* (2012.01)
*B24B 37/24* (2012.01)
(Continued)

(52) U.S. Cl.
CPC .............. *B24B 37/22* (2013.01); *B24B 37/24* (2013.01); *B32B 5/022* (2013.01); *B32B 27/12* (2013.01);
(Continued)

(58) Field of Classification Search
CPC ......... B24B 37/22; B24B 37/24; B32B 5/022; B32B 27/12; B32B 27/283;
(Continued)

(56) References Cited

U.S. PATENT DOCUMENTS

2018/0012788 A1   1/2018 Oka et al.

FOREIGN PATENT DOCUMENTS

| CN | 101298129 A | 11/2008 |
|---|---|---|
| JP | 2010-201588 A | 9/2010 |

(Continued)

OTHER PUBLICATIONS

Translation of JP3166396 (Year: 2011).*
Translation of JP2010201588 (Year: 2010).*
Translation of JP201410848 (Year: 2014).*

*Primary Examiner* — Duy Vu N Deo
(74) *Attorney, Agent, or Firm* — Roberts & Roberts, LLP

(57) ABSTRACT

A polishing method using a polishing pad including a specific adsorption layer. The polishing pad has an adsorption layer including a silicone including linear polyorganosiloxane having vinyl groups only at both ends, and the like. The polishing pad is fixed to a surface plate, and a product to be polished is pressed against the polishing pad, and simultaneously slid to polish the product to be polished. In this case, the surface roughness (Ra) of the surface plate is set to 0.01 to 0.7 μm, and the adsorption layer of the polishing pad is then adsorbed and fixed to the surface plate to perform polishing work. By adjusting the surface roughness of the surface plate as described above, a surface of the product to be polished can be inhibited from being unpredictably scratched or roughened. The method for adjusting the surface roughness of the surface plate is preferably a method in which a film having a surface roughness as described above is bonded to a surface of the surface plate.

8 Claims, 2 Drawing Sheets

(51) Int. Cl.
*B32B 5/02* (2006.01)
*B32B 27/12* (2006.01)
*B32B 27/28* (2006.01)
*H01L 21/02* (2006.01)

(52) U.S. Cl.
CPC ........ *B32B 27/283* (2013.01); *B32B 2250/03* (2013.01); *B32B 2262/02* (2013.01); *B32B 2307/724* (2013.01); *H01L 21/02024* (2013.01)

(58) Field of Classification Search
CPC ............ B32B 2250/03; B32B 2262/02; B32B 2307/724; B32B 7/12; B32B 9/005; B32B 15/082; B32B 2262/0261; B32B 2307/538; B32B 2307/732; B32B 2457/20; B32B 5/18; B32B 9/045; B32B 15/09; B32B 15/18; B32B 27/065; B32B 27/08; B32B 27/302; B32B 27/304; B32B 27/308; B32B 27/32; B32B 27/34; B32B 27/36; B32B 27/40; B32B 2266/0278; B32B 2307/546; B32B 2307/714; B32B 2457/14; H01L 21/02024; H01L 21/304
See application file for complete search history.

(56) References Cited

FOREIGN PATENT DOCUMENTS

| | | |
|---|---|---|
| JP | 3166396 U | 3/2011 |
| JP | 2014-108498 A | 6/2014 |
| JP | 2014-15110 A | 8/2014 |
| JP | 2016-171261 A | 9/2016 |

* cited by examiner

METHOD FOR POLISHING USING POLISHING PAD PROVIDED WITH ADSORPTION LAYER

TECHNICAL FIELD

The present invention relates to a polishing method in which a member to be polished, such as a semiconductor wafer to be used for semiconductor components, electronic components and the like, is polished with a polishing pad having a specific configuration. Specifically, the present invention relates to a polishing method with which working efficiency can be improved in a step of polishing a large number of members to be polished, and polish quality can be maintained at a high level.

BACKGROUND ART

A process of producing a semiconductor element, a semiconductor component or an electronic component such as a semiconductor device, a semiconductor wafer, a glass substrate for displays or a substrate for hard discs includes a polishing step for flattening or mirror-finishing the surface of such an element or component. In the polishing step, in general, a member to be polished is held on one surface plate of a polishing apparatus, a polishing pad is fixed to the other surface plate of the polishing apparatus, and the member to be polished and the polishing pad are then slid with respect to each other while a polishing slurry is supplied.

The method for fixing a polishing pad to a surface plate in the polishing method in which a polishing pad is used has been typically an adhesive fixation with a pressure-sensitive adhesive such as a pressure-sensitive adhesive tape. This fixation method enables a polishing pad to be firmly fixed, but requires much time and labor for working for replacing the polishing pad. In a step of polishing a semiconductor wafer or the like, a large number of materials to be polished are polished, and therefore wear and replacement of a polishing pad cannot be avoided. Thus, fixation by adhesion is a method poor in terms of working efficiency of a polishing step.

With regard to a method for fixing a polishing pad, the applicant of the present application developed a polishing pad with a specific adsorption layer on the basis of the fixation by adhesion (Patent Document 1). In the polishing pad, an adsorption layer having a specific configuration is provided on a back surface of a polishing layer (a surface on the surface plate side) as shown in FIG. 3. As the name suggests, the adsorption layer here is intended to fix the polishing pad to the surface plate by the adsorption action of the adsorption layer. Unlike a conventional method based on stickiness of, for example, a pressure sensitive adhesive, the above-mentioned fixation method does not allow a residual material to remain in separation of the polishing pad from the surface plate. Further, since the polishing pad is easily attached again after being separated, the polishing pad can be smoothly separated and fixed, so that replacement working can be efficiently performed.

RELATED ART DOCUMENT

Patent Document

Patent Document 1: JP 5765858 B2

SUMMARY OF THE INVENTION

Problems to be Solved by the Invention

The polishing pad including an adsorption layer can contribute to enhancement of efficiency of polishing work, and help enhance accuracy of a polished surface. A polished product has been required to have a higher flatness degree as the density, the fineness and the area of a semiconductor component have been increased in recent years, and the polishing pad can meet this requirement.

However, the present inventors found that even in a polishing method using the polishing pad including an adsorption layer, a surface of a product to be polished was unpredictably scratched and roughened. The deterioration of polishing accuracy is not necessarily ascribable to a polishing pad and a polishing agent used, and countermeasures against the deterioration of polishing accuracy are desired. Thus, the present invention provides a polishing method using the polishing pad having an adsorption layer, the method enabling stable polishing work to be continuously performed.

Means for Solving the Problems

The present inventors extensively conducted studies for achieving the above-described object, and resultantly focused on improvement of a fixed state of a polishing pad and a surface plate. Specifically, it was found that by strictly regulating the surface state, particularly the surface roughness, of a surface plate, the fixed state of the polishing pad was improved to solve the above-described problem, leading to the present invention.

That is, the present invention provides a polishing method in which a polishing pad is fixed to a surface plate, and a product to be polished is pressed against the polishing pad, and simultaneously slid to polish the product to be polished, the polishing pad including an adsorption layer for adsorbing and fixing the polishing pad to the surface plate, and a polishing layer for polishing the product to be polished, the adsorption layer including a composition obtained by cross-linking at least one silicone selected from a silicone including linear polyorganosiloxane having vinyl groups only at both ends, a silicone including linear polyorganosiloxane having vinyl groups at both ends and side chains, a silicone including branched polyorganosiloxane having vinyl groups only at both ends, and a silicone including branched polyorganosiloxane having vinyl groups at both ends and side chains, the method including setting a surface roughness (Ra) of the surface plate to 0.01 to 0.7 μm, and then adsorbing and fixing the adsorption layer of the polishing pad to the surface plate.

Hereinafter, the present invention will be described in detail. As described above, in the present invention, a surface state of a surface plate is improved, and a polishing pad is then adsorbed and fixed in polishing work to obtain preferred polish quality. Thus, focusing on the surface roughness that is a surface state of a surface plate in the present invention is related to properties of an adsorption layer of a polishing pad to be used in the present invention.

That is, the adsorption layer of the polishing pad is physically adsorbed and fixed to the surface plate. The characteristic of this fixed state is that the shearing force (fixing strength in a direction horizontal to the surface of the surface plate) is high, while the peel force (fixing strength in a direction perpendicular to the surface of the surface plate) is low.

Here, in the above-described polishing pad developed by the applicant of the present application, the surface roughness of the surface of the adsorption layer is set within a specific range with consideration given to a relationship of fixing strength between the adsorption layer and the surface plate (see claim 1 in Patent Document 1). Optimization of the polishing pad with respect to the surface of the adsorption layer is effective, but according to the present inventors, the polishing pad can be more effectively improved by properly adjusting the surface roughness of the surface plate.

That is, when the surface of the surface plate is rough, a polishing force is not necessarily uniformly propagated even when the surface roughness on the polishing pad side (adsorption layer) is optimized. In this case, defects occur in the fixed state of the polishing pad, the polishing pad is subtly shifted, and in some cases, the polishing pad is peeled from the surface plate. Further, such a surface state of the surface plate, which may affect polishing accuracy, does not necessarily occur from early stages of polishing work. In other words, there are cases where the surface of the surface plate is rough from the beginning of production, and where the surface plate is flat and has a small surface roughness originally, but is changed in the process of being used. In the latter case, for example, the surface roughness may increase due to contact in polishing pad replacement work, or the like. The characteristic of the present invention is that while the above-mentioned circumstances are considered, the surface state of the surface plate is suitably adjusted independently of the history.

The polishing method according to the present invention will be described in more detail. Hereinafter, a configuration of a polishing pad to be used in the present invention, a surface roughness of a surface plate and a method for adjusting the surface roughness will be described.

A. Polishing Pad

The polishing, pad for use in the present invention has as essential components an adsorption layer on the surface plate side and a polishing layer on the side of a product to be polished.

The material of the adsorption layer is basically the same as that used for the conventional polishing pad developed by the present inventors. That is, the polishing pad is formed by stacking a composition obtained by crosslinking at least one silicone selected from a silicone including linear polyorganosiloxane having vinyl groups only at both ends, a silicone including linear polyorganosiloxane having vinyl groups at both ends and side chains, a silicone including branched polyorganosiloxane having vinyl groups only at both ends, and a silicone including branched polyorganosiloxane having vinyl groups at both ends and side chains.

As specific examples of the silicone, examples of the linear polyorganosiloxane include compounds of Chemical Formula 1. Further, examples of the branched polyorganosiloxane include compounds of Chemical Formula 2.

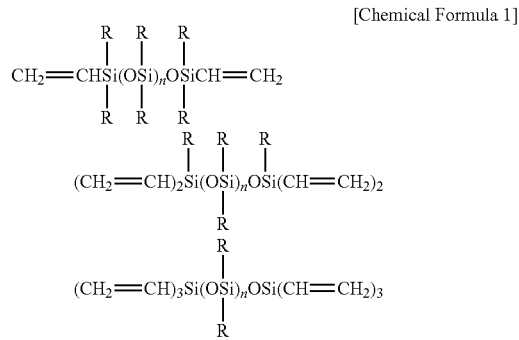

[Chemical Formula 1]

(R represents an organic group as described below, and n represents an integer).

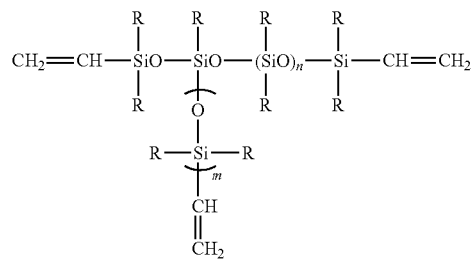

[Chemical Formula 2]

(R represents an organic group as described below, and m and n each represent an integer).

Specific examples of the substituent (R) in Chemical Formulae 1 and 2 include alkyl groups such as a methyl group, an ethyl group and a propyl group; aryl groups such as a phenyl group and a tolyl group; and monovalent hydrocarbon groups in which some or all of hydrogen atoms bonded to the above-mentioned alkyl group or aryl group are substituted with halogen atoms, cyano groups or the like, homologous or heterologous unsubstituted or substituted aliphatic unsaturated groups. The polyorganosiloxane is preferably one containing methyl groups in an amount of 50 mol %. The substituents may be heterologous or homologous. The polysiloxane may be a single polysiloxane or a mixture of two or more polysiloxanes.

Further, the silicone that forms the adsorption layer has a preferred adsorption effect when the silicone has a number average molecular weight of 30000 to 100000. However, adjustment of the surface roughness is affected by the number average molecular weight of a silicone used and the firing temperature in the production stage. The number average molecular weight of the silicone is preferably 30000 to 60000 for easily exhibiting a preferred surface roughness.

The polishing pad for use in the present invention has as an essential element a polishing layer in addition to the adsorption layer. For this polishing layer, a polishing cloth that is used for a general polishing pad is used. For example, a nonwoven fabric formed of nylon, polyurethane, polyethylene terephthalate or the like, a foamed molded product, or the like can be used. Further, the shape of the surface (polishing surface) of the polishing cloth is not limited to a flat shape, and grooves or the like for holding a polishing agent may be appropriately formed.

Further, the polishing pad is preferably one in which a base material for supporting the adsorption layer and the polishing layer is present between these layers. The adsorption layer is composed of a thin organic substance, has high flexibility, and is poor in handleability when directly bonded to the polishing layer. Thus, a base material having moderate rigidity is set between the adsorption layer and the polishing layer, the handleability of the polishing pad can be secured. Further, deformation in polishing work can be suppressed by imparting moderate rigidity to the polishing pad.

As the base material, a sheet-shaped resin material is used. Specific examples of the resin material resins such as those of polyester, polyethylene, polystyrene, polypropylene, nylon, urethane, polyvinylidene chloride and polyvinyl chloride. Polyester-based resin materials, i.e. polyethylene terephthalate (PET) and polyethylene naphthalate (PEN), are preferable, with PET being especially preferable. The base material may have a single layer, or a multilayer structure with a plurality of resins.

In the polishing pad including an adsorption layer and a polishing layer, the thickness of the adsorption layer is preferably 20 to 30 μm. Further, the thickness of the polishing cloth forming the polishing layer is 0.5 to 3 mm. The thickness of the base material set as necessary is preferably 50 to 200 μm.

Further, the polishing pad for use in the present invention is preferably one in which a surface of the adsorption layer on the surface plate side has a surface roughness (Sa) of 0.06 μm or less. This is because when the surface roughness (Sa) is more than 0.06 μm, the in-plane uniformity of the polishing force may be affected. Essentially, the lower limit of the surface roughness should not be limited, but the minimum value with which the adsorption layer is producible is 0.02 μm. The surface roughness here is an arithmetic average roughness (Ra).

The surface roughness of the adsorption layer means an average of the in-plane surface roughness of the adsorption layer, and is an average of measured values of the surface roughness at a plurality of portions of the adsorption layer such as a central portion and end portions (outer peripheral portions). Preferably, an average value of the surface roughness at three spots: a central portion and both end portions of the adsorption layer is employed. The surface roughness of the adsorption layer is preferably uniform for exhibiting more preferred polishing performance. Specifically, for the surface roughness (Sc) at the central portion of the adsorption layer and the surface roughness (So) at the end portion of the adsorption layer, each of the difference between Sc and Sa and the difference between So and Sa is preferably 0.02 μm or less. For the surface roughness at the end portion of the adsorption layer, the above-described relationship is preferably satisfied at both ends of the polishing pad diameter.

B. Surface State of Surface Plate

In the present invention, the above-described polishing pad is adsorbed and fixed to the surface plate to polish a product to be polished. The surface roughness of the surface plate is adjusted to 0.01 to 0.7 μm before the polishing pad is fixed.

When the surface roughness of the surface plate is more than 0.7 μm, the fixed state of the polishing pad may slightly destabilized, leading to deterioration of polishing accuracy. Further, when the surface of the surface plate is excessively rough, the polishing pad may be peeled. Preferably, the surface roughness is reduced as much as possible, but the lower limit of the surface roughness is 0.01 μm from a practical point of view. Thus, in the present invention, the surface state of the surface plate is regulated as a method for improving the accuracy with which a product to be polished is polished in directions other than those along main members in polishing work, such as a polishing pad and a polishing agent. The surface roughness here is also an arithmetic average roughness (Ra). Further, it is preferable to employ an average value of the in-plane surface roughness as the surface roughness of the surface plate, and it is preferable that an average of measured values of the surface roughness at a plurality of portions of the surface plate such as a central portion and end portions (outer peripheral portions) is defined as the surface roughness of the surface plate.

Further, the surface roughness of the surface plate is preferably controlled to be 0.01 to 0.25 μm. In work for polishing various materials, usually the surface plate and the polishing pad are disposed on the lower side, a product to be polished is disposed thereon, and one surface of the product is polished as in FIG. 1, but for polishing both surfaces of a product to be polished, the polishing pad may be simultaneously pressed against the upper and lower surfaces of the product to perform polishing work as in FIG. 2. In these cases, on the lower-side polishing surface (lower surface plate) in one-surface polishing in FIG. 1 and both-surface polishing in FIG. 2, a high effect can be obtained by controlling the surface roughness of the surface plate to be 0.7 μm or lower. On the other hand, on the upper-side polishing surface (upper surface plate) in FIG. 2, the adsorption power between the surface plate and the polishing pad decreases due to the principle of gravity, and in view of this, it is preferable to further decrease the surface roughness of the surface plate. Accordingly, considering polishing work against upper and lower surfaces as in FIG. 2, the surface roughness of the surface plate is preferably controlled to be 0.01 to 0.25 μm. It is also effective to set the surface roughness of the surface plate to 0.25 μm or less in one-surface polishing as in FIG. 1.

Here, as a specific method for adjusting the surface roughness of a surface plate, the surface of the surface plate is polished to set the surface roughness within the above-described range before installation of a polishing pad. However, it is difficult to uniformly adjust the surface roughness of a surface plate having a large area. As a preferred method for adjusting the surface roughness of the surface plate, a film material having a surface roughness of 0.01 to 0.7 μm is bonded to the surface of the surface plate. A desired surface roughness can be quickly attained by covering the surface of the surface plate with the film material. Further, a uniform surface roughness can be imparted even to a surface plate having a large area. The surface roughness of the film material is more preferably 0.01 to 0.25 μm.

The material of the film material is preferably an organic material or plastic material such as a PET resin, an acrylic resin, a vinyl chloride resin or an ABS resin. This is intended for securing handleability and corrosion resistance to a liquid such as a polishing agent. The thickness of the film material is not particularly limited, but is preferably 50 μm to 3.0 mm. Further, the film material is only required to be identical in shape and area to at least the polishing pad, and it is not necessarily required to cover the entire surface of the surface plate. However, when a polishing agent infiltrates between the film material and the surface plate during polishing work, there is a risk of film peeling, and therefore it is preferable to cover the surface of the surface plate with the film material.

Preferably, the film material and the surface plate are bonded to each other with an adhesive tape or an adhesive. This is because it is necessary to stably fix the polishing pad by firmly bonding the film material to the surface plate. In this respect, the polishing pad is necessarily exchanged in a polishing step, and therefore a moderate bonding force by the adsorption layer is required, but since the film material is not required to be exchanged in principle, it is acceptable to firmly bond the film material to the surface plate. As the adhesive, for example, a rubber-based adhesive, an acryl-based adhesive, a hotmelt adhesive or the like is used.

The present invention is characterized by controlling the surface state of a surface plate, and in the present invention, the material of the surface plate is not limited. As surface plates for polishing apparatuses, surface plates made of ceramics such as alumina, stainless surface plates, surface plates made of SiC, surface plates made of steel and the like are available, and the present invention is useful for any of these surface plates.

C. Fixation of Polishing Pad and Polishing Method of the Invention

After the surface roughness of the surface plate is adjusted as described above, the polishing pad (adsorption layer) is adsorbed and fixed to the surface plate. For fixing the polishing pad, the polishing pad is only required to be aligned with and mounted on the surface plate, and lightly pressed.

After the polishing pad is fixed to the surface plate, a polishing agent is supplied, and simultaneously a product to be polished is pressed against the polishing pad to perform polishing work. Conditions for the polishing work may be identical to those in a usual polishing method. The conditions are only required to be set in consideration of the material of a product to be polished, the type and particle size of a polishing agent, and the surface state required for the product to be polished.

Since a large number of products to be polished are polished, the polishing pad is worn and degraded, and therefore replacement of the polishing pad is necessary. Here, the polishing pad for use in the present invention can be relatively easily separated by pulling the polishing pad in a direction perpendicular to the surface of the surface plate. Further, work for fixing a new polishing pad is easy. When a film material having a specific roughness is bonded to the surface plate, stable polishing work can be continued after replacement of the polishing pad.

Advantageous Effects of the Invention

As described above, in the polishing method according to the present invention, a polishing pad to be used is optimized, and the surface state of a surface plate is suitably adjusted to perform polishing work. Accordingly, workability can be improved, and accuracy of a polished surface can be enhanced.

DESCRIPTION OF EMBODIMENT

Figure 2:
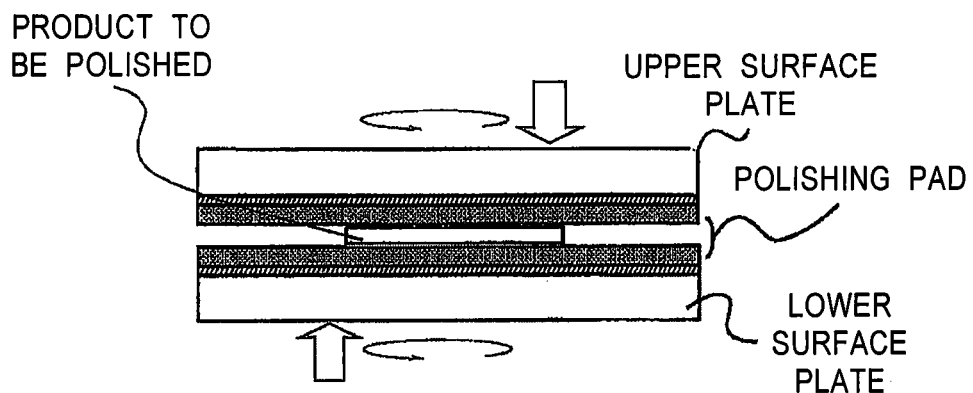
FIG. 2 is a diagram illustrating a configuration of an apparatus (upper and lower surface plates) for both-surface polishing.
Figure 3:
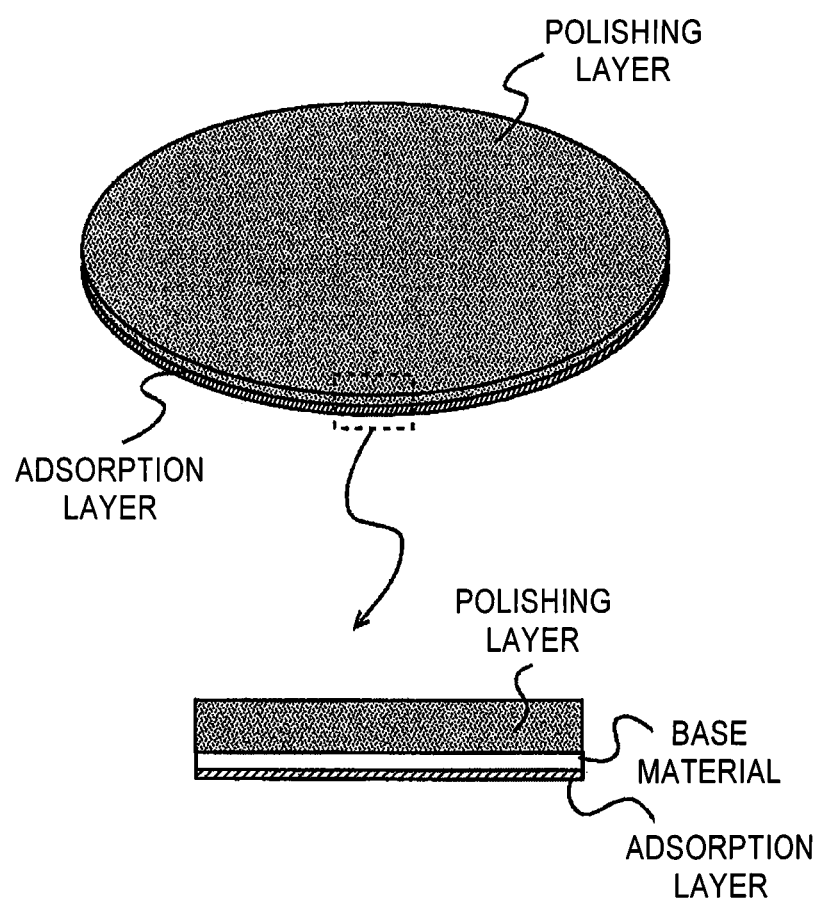
FIG. 3 is a diagram illustrating a configuration of a polishing pad including an adsorption layer.

Hereinafter, a preferred embodiment of the present invention will be described. In this embodiment, a polishing pad having the same configuration as in FIG. 2 was used. In the polishing pad, an adsorption layer thickness: 25 μm) including a silicone (molecular weight: 30000) including linear polyorganosiloxane having vinyl groups only at both ends is bonded to one surface of a circular PET base material (thickness: 50 μm and size: φ 810 mm). A suede-like polishing cloth (model: 7355-000F: nap length: 450 μm, thickness: 1.37 mm) is bonded to the other surface of the base material. For the polishing pad, the surface roughness (Ra) of the surface of the adsorption layer was measured with a surface roughness measuring device in accordance with JIS B0601-1994, and the result showed that the average value of the surface roughness was 0.04 μm.

Figure 1:
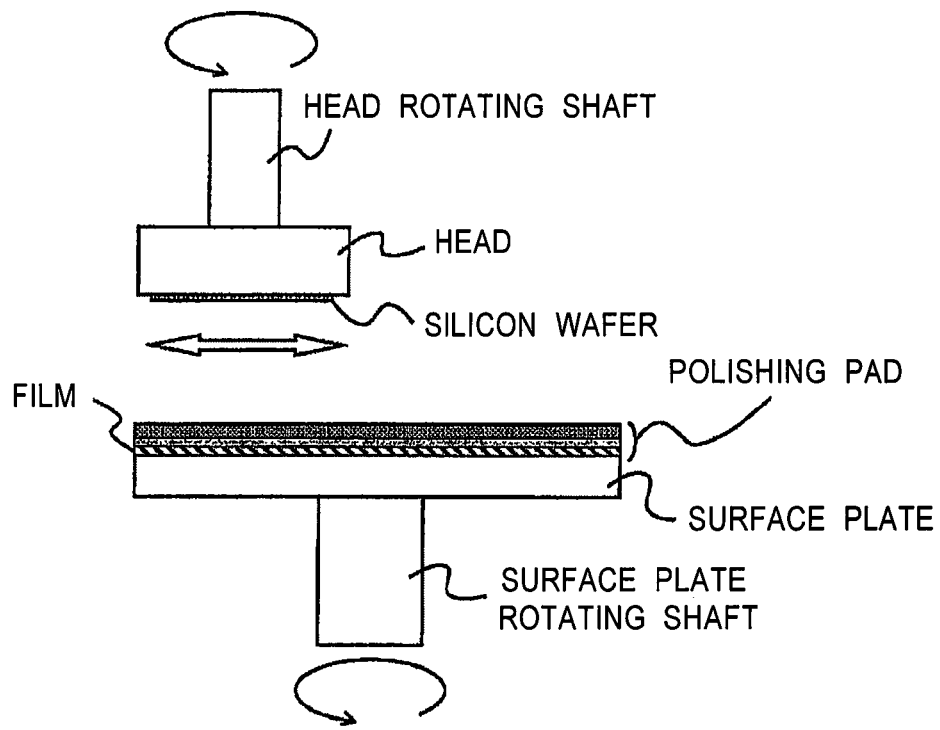
FIG. 1 is a schematic diagram for illustrating general polishing work (one-surface polishing).

With the polishing pad, a polishing test of a silicon wafer (φ 8 inches) was conducted in the mode shown in FIG. 1. The surface plate of the polishing apparatus was made of a ceramic, and had a surface roughness Ra of 1.0 μm. In the polishing test in this embodiment, a plurality of PET films (thickness: 200 μm) different in average surface roughness was bonded to the surface plate of the polishing apparatus, and the polishing test was conducted. For fixing the PET film, a rubber-based adhesive tape was attached to the surface plate, and the film was pressed to be bonded. Thereafter, the polishing pad was attached to the film surface of the surface plate. In work for polishing the silicon wafer, a polishing agent slurry (Glanzox (manufactured by Fujimi Inc.) diluted with pure water by 30 times) was added dropwise to the polishing layer (flow rate: 150 ml/min). Other polishing conditions are as follows.

Polishing pressure: 0.163 kgf/cm$^2$
Rotation speed of polishing pad: 45 rpm
Rotation speed of member to be polished: 47 rpm
Oscillation speed of head: 250 mm/min
Polishing time: 3 min
Number of sheets polished: 1 or 10

In the polishing test in this embodiment, as a comparative example, the polishing pad was fixed without bonding a film to the surface plate, the silicon wafer was polished, and evaluation was performed. The polishing test in which a film having a surface roughness of 0.8 μm was bonded is referred to as a reference example.

After the polishing test, the polished surface of the wafer was washed with pure water, and dried in a dust-free state, the polished surface was then observed, the size and number of scratches were determined, and evaluation was performed in a point-deduction scoring system with the perfect score set to 100 points. Here, the number of points deducted was increased as the size of a scratch became larger. As for evaluation results, a sample scoring 95 points or more and 100 points or less was rated "⊙", a sample scoring 90 points or more and less than 95 points was rated "o", a sample scoring 85 points or more and less than 90 points was rated "Δ", and a sample scoring less than 85 points was rated "x". The evaluation results are shown in Table 1.

TABLE 1

| | Surface roughness of surface plate (μm) | Evaluation of polishing accuracy | |
|---|---|---|---|
| | | 1 sheet | 10 sheets |
| Example 1 | 0.03 | ⊙ | ⊙ |
| Example 2 | 0.25 | ⊙ | ⊙ |
| Example 3 | 0.40 | ⊙ | ⊙ |
| Example 4 | 0.70 | ⊙ | ⊙ |
| Reference Example | 0.80 | ⊙ | Δ |
| Comparative Example | 1.00 | ⊙ | X |

Table 1 shows that in each of Examples 1 to 4, the comparative example and the reference example, there was no particular problem in polishing accuracy in the initial stage of polishing (the number of sheets polished: 1). However, when the number of sheets polished increased (10 sheets), polishing accuracy was deteriorated in the reference example and the comparative example. This may be because as wear of the polishing pad increased with the number of sheets polished, variation in conditions of friction between the polishing layer and the surface to be polished and an associated change in fixed state of the polishing pad and the surface plate interacted with each other, so that the surface of the material to be polished was affected. From these results, it can be confirmed that improvement of the surface roughness of the surface plate is required, and as a basis thereof, the surface roughness is required to be 0.7 µm or less.

In a normal step of polishing a silicon wafer, 10 wafers are not necessarily treated with one polishing pad, and the polishing pad is appropriately replaced in general. Therefore, this embodiment involves an acceleration test. However, wear of the polishing pad cannot be easily predicted. Thus, the evaluation results in this embodiment show that even if the pad is unexpectedly worn, polish quality can be maintained by adjusting the surface state of the surface plate. Bonding of the film material used in this embodiment is relatively easy work. This embodiment is a useful study because it reveals that polish quality can be maintained by the above-mentioned approach.

INDUSTRIAL APPLICABILITY

As described above, the polishing method according to the present invention is capable of continuously forming a high-quality polished surface while having convenience from the use of a polishing pad having an adsorption layer. The present invention can provide a high-accuracy polished surface even for wafers and display panels having increased diameters and areas.

The invention claimed is:

1. A polishing method which comprises providing a polishing pad which is fixed to a surface plate, and a product to be polished is pressed against the polishing pad, and simultaneously slid to polish the product to be polished,
   wherein the polishing pad comprises an adsorption layer for adsorbing and fixing the polishing pad to the surface plate, and a polishing layer for polishing the product to be polished,
   the adsorption layer comprises a composition obtained by crosslinking at least one silicone selected from a silicone including linear polyorganosiloxane having vinyl groups only at both ends, a silicone including linear polyorganosiloxane having vinyl groups at both ends and side chains, a silicone including branched polyorganosiloxane having vinyl groups only at both ends, and a silicone including branched polyorganosiloxane having vinyl groups at both ends and side chains, and
   bonding a film having a surface roughness (Ra) of 0.01 to 0.25 µm to a surface of the surface plate to thereby set a surface roughness (Ra) of the surface plate to 0.01 to 0.25 µm, and then adsorbing the adsorption layer of the polishing pad to the film to thereby fix the polishing pad to the surface plate.

2. The polishing method according to claim 1, wherein a surface roughness average value (Sa) of the adsorption layer of the polishing pad is 0.02 to 0.06 µm.

3. The polishing pad according to claim 1, wherein the adsorption layer has a thickness of 20 to 30 µm.

4. The polishing method according to claim 1, wherein the polishing pad comprises a base material between the adsorption layer and the polishing layer, and the base material comprises a resin having a rupture strength of 210 to 290 MPa and a rupture elongation of 80 to 130%.

5. The polishing pad according to claim 2, wherein the adsorption layer has a thickness of 20 to 30 µm.

6. The polishing method according to claim 2, wherein the polishing pad comprises a base material between the adsorption layer and the polishing layer, and the base material comprises a resin having a rupture strength of 210 to 290 MPa and a rupture elongation of 80 to 130%.

7. The polishing method according to claim 3, wherein the polishing pad comprises a base material between the adsorption layer and the polishing layer, and the base material comprises a resin having a rupture strength of 210 to 290 MPa and a rupture elongation of 80 to 130%.

8. The polishing method according to claim 5, wherein the polishing pad comprises a base material between the adsorption layer and the polishing layer, and the base material comprises a resin having a rupture strength of 210 to 290 MPa and a rupture elongation of 80 to 130%.

* * * * *